United States Patent
Roussillon et al.

(10) Patent No.: US 8,601,973 B2
(45) Date of Patent: Dec. 10, 2013

(54) SOLUTION DEPOSITION ASSEMBLY

(75) Inventors: Yann Roussillon, Sunnyvale, CA (US); Piyaphant Utthachoo, San Jose, CA (US)

(73) Assignee: Nanosolar, Inc., San Jose, CA (US)

( * ) Notice: Subject to any disclaimer, the term of this patent is extended or adjusted under 35 U.S.C. 154(b) by 967 days.

(21) Appl. No.: 12/203,117

(22) Filed: Sep. 2, 2008

(65) Prior Publication Data

US 2009/0120359 A1    May 14, 2009

Related U.S. Application Data (60) Provisional application No. 60/969,622, filed on Sep. 1, 2007.

(51) Int. Cl.
  *B05B 7/00*   (2006.01)
  *B05C 3/02*   (2006.01)
  *C23C 14/00*  (2006.01)

(52) U.S. Cl.
  USPC ............. 118/300; 118/58; 118/404; 118/415; 118/429; 198/373; 204/206

(58) Field of Classification Search
  USPC ........... 118/300, 58, 404, 415, 419, 420, 429; 145/518; 204/206, DIG. 7; 198/373; 148/518
  See application file for complete search history.

(56) References Cited

U.S. PATENT DOCUMENTS

| | | | |
|---|---|---|---|
| 4,426,266 A * | 1/1984 | Ukena et al. | 204/206 |
| 4,798,660 A | 1/1989 | Ermer et al. | |
| 4,915,745 A | 4/1990 | Pollock et al. | |
| 5,410,796 A | 5/1995 | Weeks, Jr. | |
| 5,476,811 A | 12/1995 | Fujii et al. | |
| 5,997,956 A | 12/1999 | Hunt et al. | |
| 6,048,442 A | 4/2000 | Kushiya et al. | |
| 6,092,669 A | 7/2000 | Kushiya et al. | |
| 6,383,359 B2 * | 5/2002 | Arao et al. | 205/155 |
| 6,537,845 B1 | 3/2003 | McCandless et al. | |
| 6,547,876 B2 | 4/2003 | Ferguson et al. | |
| 6,923,625 B2 | 8/2005 | Sparks | |
| 2001/0006734 A1 | 7/2001 | Demiryont | |
| 2007/0264436 A1 * | 11/2007 | Dordi et al. | 427/443.1 |

OTHER PUBLICATIONS

Notice of Allowance of Sep. 9, 2013 for U.S. Appl. No. 12/369,524.

* cited by examiner

*Primary Examiner* — Yewebdar Tadesse

(74) *Attorney, Agent, or Firm* — Joshua D. Isenberg; JDI Patent (57) ABSTRACT

Methods and devices are provided for improved sputtering systems. In one embodiment of the present invention, a deposition system for use with a substrate, the system comprising a solution deposition apparatus; at heating chamber; and at least assembly for holding solution over the substrate to allow for a depth of at least about 0.5 microns to 10 mm.

20 Claims, 7 Drawing Sheets

FIG. 8

SOLUTION DEPOSITION ASSEMBLY

CROSS-REFERENCE TO RELATED APPLICATION

The application claims priority to U.S. Provisional Application Ser. No. 60/969,622 filed Sep. 1, 2007, fully incorporated herein by reference for all purposes.

FIELD OF THE INVENTION

This invention relates generally to deposition systems, and more specifically, liquid systems for use with forming photovoltaic devices.

BACKGROUND OF THE INVENTION

Solar cells and solar modules convert sunlight into electricity. These electronic devices have been traditionally fabricated using silicon (Si) as a light-absorbing, semiconducting material in a relatively expensive production process. To make solar cells more economically viable, solar cell device architectures have been developed that can inexpensively make use of thin-film, light-absorbing semiconductor materials such as copper-indium-gallium-di-(sulfo-selenide, Cu(In, Ga)(S, Se)$_2$, also termed CI(G)S(S). This class of solar cells typically has a p-type absorber layer sandwiched between a back electrode layer and an n-type junction partner layer. The back electrode layer is often Mo, while the junction partner is often CdS. A transparent conductive oxide (TCO) such as zinc oxide (ZnO$_x$) typically doped with aluminum is formed on the junction partner layer and is typically used as a transparent electrode. CIS-based solar cells have been demonstrated to have power conversion efficiencies exceeding 19%.

High throughput production methods are being developed to manufacture this type of thin-film photovoltaic device. As improvements are made for high throughput production of the absorber layer, similar advances need to be made with regards the deposition or formation of the junction partner layer to prevent bottlenecking of the production process.

It should be understood, however, that the materials used for forming the junction partner may contain extremely toxic material and difficulties are encountered in improving the manufacturing system. One process for forming the junction partner involves using Group II-VI compounds such as CdS. The CdS used in the formation process may create hazardous waste by-products, thus increasing processing costs. Known processes are also inefficient or unreliable in creating a system with high throughput and high yield. Some known systems either use too much starting material, much of which is wasted during production. Others use systems that may be susceptible to imperfections in the underlying substrate that may cause non-uniform deposition of the junction partner material over a wide web. Therefore, a need exists in the art for an improved junction partner deposition system.

SUMMARY OF THE INVENTION

Embodiments of the present invention address at least some of the drawbacks set forth above. The present invention provides for the improved deposition system for group IIB-VIA materials. Although not limited to the following, these improved module designs are well suited for roll-to-roll, in-line processing equipment. It should be understood that at least some embodiments of the present invention may be applicable to any type of solar cell, whether they are rigid or flexible in nature or the type of material used in the absorber layer. Embodiments of the present invention may be adaptable for roll-to-roll and/or batch manufacturing processes. At least some of these and other objectives described herein will be met by various embodiments of the present invention.

In one embodiment of the present invention, a deposition system for use with a substrate, the system comprising a solution deposition apparatus; at heating chamber; and at least assembly for holding solution over the substrate to allow for a depth of at least about 0.5 microns to 10 mm.

It should be understood that any of the embodiments herein may be adapted to include the following feature(s). In one embodiment, the substrate comprises of a flexible material. Optionally, the system includes multiple zones at different temperatures. Optionally, certain zones have enclosed atmospheres. Optionally, a movable seal system defines a volume over which fluid is held over the substrate. Optionally, the movable seal system uses seals that move at the same rate as the substrate in a continuous process. Optionally, the temperature is less than the temperature of the solution or dispersion to be deposited. Optionally, both the solution and the substrate are at substantially the same temperature. Optionally, neither the solution or the substrate are heated and both are at ambient temperatures. Optionally, the substrate is heated from ambient to about 60-90 C. but the solution is at a still higher temperature. Optionally, the substrate comprises of a metal foil. Optionally, the substrate comprises of a metal foil coated with a thin film semiconductor. Optionally, the solution comprises a precursor for forming a junction partner for a group IB-IIIA-VIA absorber layer Optionally, the substrate comprises of a metal foil. the solution comprises a precursor for forming a Group IIB-VIA junction partner. Optionally, the solution comprises a precursor for forming a junction partner selected from the group consisting of: cadmium sulfide (CdS), zinc sulfide (ZnS), zinc hydroxide, zinc selenide (ZnSe). Optionally, the solution comprises of a Group IIB ionic species is obtained from an aqueous solution of one or more of the following: sulfate, acetate, bromide, fluoride, chloride, iodide, hydroxide, nitrate, oxalate, citrate, phosphate, tungstate, or hydrates of the Group IIB species. Optionally, the solution comprises of a Group VIA ionic species is obtained from an aqueous solution of one or more of the following: oxides, halides, sulfates, nitrates, or ureates of the Group VIA species. Optionally, the solution has a pH of from about 9 to about 14. Optionally, the solution has a pH of from about 11 to about 12. Optionally, the assembly for holding solution is at least partially contained in the heating chamber.

A further understanding of the nature and advantages of the invention will become apparent by reference to the remaining portions of the specification and drawings.

DESCRIPTION OF THE SPECIFIC EMBODIMENTS

It is to be understood that both the foregoing general description and the following detailed description are exemplary and explanatory only and are not restrictive of the invention, as claimed. It may be noted that, as used in the specification and the appended claims, the singular forms "a", "an" and "the" include plural referents unless the context clearly dictates otherwise. Thus, for example, reference to "a material" may include mixtures of materials, reference to "a compound" may include multiple compounds, and the like. References cited herein are hereby incorporated by reference in their entirety, except to the extent that they conflict with teachings explicitly set forth in this specification.

In this specification and in the claims which follow, reference will be made to a number of terms which shall be defined to have the following meanings:

"Optional" or "optionally" means that the subsequently described circumstance may or may not occur, so that the description includes instances where the circumstance occurs and instances where it does not. For example, if a roller optionally contains a feature for a thermally conductive film, this means that the conductive film feature may or may not be present, and, thus, the description includes both structures wherein a roller possesses the conductive film feature and structures wherein the film feature is not present.

Photovoltaic Device

Figure 1:
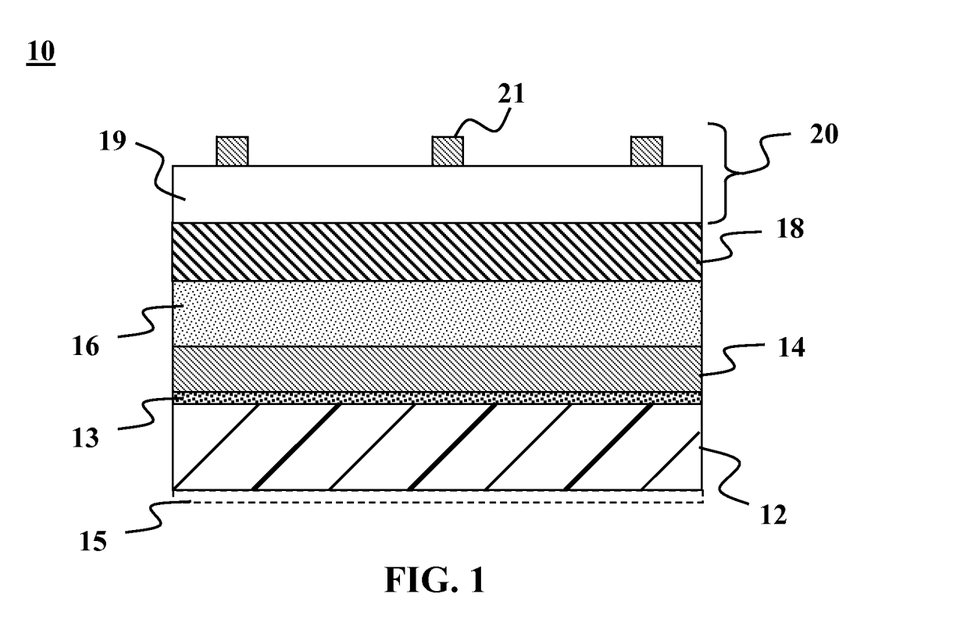
FIG. 1 is a cross-sectional view of a photovoltaic device according to one embodiment of the present invention.

Referring now to FIG. 1, the films fabricated may serve as an absorber layer in a photovoltaic device, module, or solar panel. An example of such a photovoltaic device 300 is shown in FIG. 1. The device 10 includes a base substrate 12, an optional intermediate layer 13, a base or back electrode 14, a p-type absorber layer 16 incorporating a film of the type described above, a n-type semiconductor thin film 18 and a transparent electrode 20. By way of example, the base substrate 12 may be made of a metal foil, a polymer such as polyimides (PI), polyamides, polyetheretherketone (PEEK), Polyethersulfone (PES), polyetherimide (PEI), polyethylene naphtalate (PEN), Polyester (PET), related polymers, or a metallized plastic. By way of nonlimiting example, related polymers include those with similar structural and/or functional properties and/or material attributes. The base electrode 14 is made of an electrically conductive material. By way of example, the base electrode 14 may be of a metal layer whose thickness may be selected from the range of about 0.1 micron to about 25 microns. An optional intermediate layer 13 may be incorporated between the electrode 14 and the substrate 12. The transparent electrode 20 may include a transparent conductive layer 19 and a layer of metal (e.g., Al, Ag, Cu, or Ni) fingers 21 to reduce sheet resistance.

Aluminum and molybdenum can and often do inter-diffuse into one another, especially upon heating to elevated temperatures as used for absorber growth, with deleterious electronic and/or optoelectronic effects on the device 10. Furthermore aluminum can diffuse though molybdenum into layers beyond e.g. CIG(S). To inhibit such inter-diffusion, an intermediate, interfacial layer 13 may be incorporated between the aluminum foil substrate 12 and molybdenum base electrode 14. The interfacial layer may be composed of any of a variety of materials, including but not limited to chromium, vanadium, tungsten, and glass, or compounds such as nitrides (including but not limited to titanium nitride, tantalum nitride, tungsten nitride, hafnium nitride, niobium nitride, zirconium nitride, vanadium nitride, silicon nitride, or molybdenum nitride), oxynitrides (including but not limited to oxynitrides of Ti, Ta, V, W, Si, Zr, Nb, Hf, or Mo), oxides, and/or carbides. The material may be selected to be an electrically conductive material. In one embodiment, the materials selected from the aforementioned may be those that are electrically conductive diffusion barriers. The thickness of this layer can range from 10 nm to 50 nm or from 10 nm to 30 nm. Optionally, the thickness may be in the range of about 50 nm to about 1000 nm. Optionally, the thickness may be in the range of about 100 nm to about 750 nm. Optionally, the thickness may be in the range of about 100 nm to about 500 nm. Optionally, the thickness may be in the range of about 110 nm to about 300 nm. In one embodiment, the thickness of the layer 13 is at least 100 nm or more. In another embodiment, the thickness of the layer 13 is at least 150 nm or more. In one embodiment, the thickness of the layer 13 is at least 200 nm or more. Optionally, some embodiments may include another layer such as but not limited to a copper layer, a titanium layer, or other metal layer above the layer 13 and below the base electrode layer 14. Optionally, some embodiments may include another layer such as but not limited to a copper layer, a titanium layer, an aluminum layer, or other metal layer below the layer 13 and below the base electrode layer 14. This layer may be thicker than the layer 13. Optionally, it may be the same thickness or thinner than the layer 13. This layer 13 may be placed on one or optionally both sides of the aluminum foil (shown as layer 15 in phantom in FIG. 5).

If barrier layers are on both sides of the aluminum foil, it should be understood that the protective layers may be of the same material or they may optionally be different materials from the aforementioned materials. The bottom protective layer 105 may be any of the materials. Optionally, some embodiments may include another layer 107 such as but not limited to an aluminum layer above the layer 105 and below the aluminum foil 102. This layer 107 may be thicker than the layer 103

The n-type semiconductor thin film 18 serves as a junction partner between the compound film and the transparent conducting layer 19. By way of example, the n-type semiconductor thin film 18 (sometimes referred to as a junction partner layer) may include inorganic materials such as cadmium sulfide (CdS), zinc sulfide (ZnS), zinc hydroxide, zinc selenide (ZnSe), n-type organic materials, or some combination of two or more of these or similar materials, or organic materials such as n-type polymers and/or small molecules. Layers of these materials may be deposited, e.g., by chemical bath deposition (CBD) and/or chemical surface deposition (and/or related methods), to a thickness ranging from about 2 nm to about 1000 nm, more optionally from about 5 nm to about 500 nm, and most optionally from about 10 nm to about 300 nm. This may also configured for use in a continuous roll-to-roll and/or segmented roll-to-roll and/or a batch mode system.

The transparent conductive layer 19 may be inorganic, e.g., a transparent conductive oxide (TCO) such as but not limited to indium tin oxide (ITO), fluorinated indium tin oxide, zinc oxide (ZnO) or zinc oxide (ZnO$_x$) doped with aluminum, or a related material, which can be deposited using any of a variety of means including but not limited to sputtering, evaporation, chemical bath deposition (CBD, electroplating, sol-gel based coating, spray coating, chemical vapor deposition (CVD), physical vapor deposition (PVD), atomic layer deposition (ALD), and the like. Alternatively, the transparent conductive layer may include a transparent conductive polymeric layer, e.g. a transparent layer of doped PEDOT (Poly-3,4-Ethylenedioxythiophene), carbon nanotubes or related structures, or other transparent organic materials, either singly or in combination, which can be deposited using spin, dip, or spray coating, and the like or using any of various vapor deposition techniques. Optionally, it should be understood that a non-conductive layer such as intrinsic ZnO (i-ZnO) may be used between CdS and Al-doped ZnO. Optionally, an insulating layer may be included between the layer 18 and transparent conductive layer 19. Combinations of inorganic and organic materials can also be used to form a hybrid transparent conductive layer. Thus, the layer 19 may optionally be an organic (polymeric or a mixed polymeric-molecular) or a hybrid (organic-inorganic) material. Examples of such a transparent conductive layer are described e.g., in commonly-assigned US Patent Application Publication Number 20040187317, which is incorporated herein by reference.

Those of skill in the art will be able to devise variations on the above embodiments that are within the scope of these teachings. For example, it is noted that in embodiments of the present invention, portions of the IB-IIIA precursor layers (or certain sub-layers of the precursor layers or other layers in the stack) may be deposited using techniques other than microflake-based inks. For example precursor layers or constituent sub-layers may be deposited using any of a variety of alternative deposition techniques including but not limited to solution-deposition of spherical nanopowder-based inks, vapor deposition techniques such as ALD, evaporation, sputtering, CVD, PVD, electroplating and the like.

Junction Partner Deposition System

Figure 2:
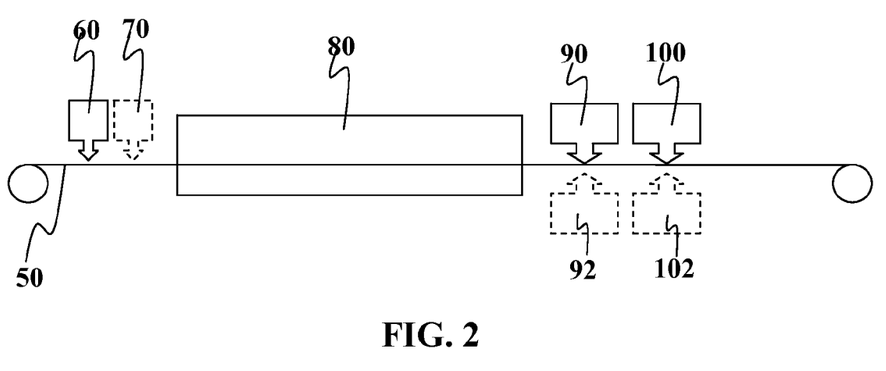
FIG. 2 shows a processing system according to one embodiment of the present invention.

Referring now to FIG. 2, one embodiment of a junction partner deposition system will now be described. In this embodiment of the invention, the deposition system may be a solution deposition system that occurs at atmospheric pressures. It should be understood that the system may also be used with vacuum, low vacuum, or subatmospheric pressures. Some embodiments may also use environments at pressures higher than atmospheric pressure.

FIG. 2 shows a system with a substrate 50 configured for use in an in-line, roll-to-roll configuration. The substrate 50 may be a coated metal or polymer substrate. The coating may be a photovoltaic absorber layer such as but not limited to Cu—In—Ga—Se, Cu—In—Se, Cu—In—Ga—S, Cu—In—Ga—Se—S, other group IB-IIIA-VIA absorbers, CdTe, or other photovoltaic absorbers that use a junction partner layer. In one embodiment, the substrate 50 is a flexible elongate substrate such as but not limited to an absorber coated metal foil. In another embodiment, the substrate 50 is a multi-layered flexible substrate such as that shown in FIG. 1. As part of the initial setup, the surface of the substrate to be processed may be cleaned prior to solution deposition.

The Group IIB ionic species may be comprised of one or more of the following: cadmium, mercury, zinc, cadmium, mercury or zinc sulfate, acetate, bromide, fluoride, chloride, iodide, hydroxide, nitrate, oxalate, citrate, phosphate, tungstate, hydrates or combinations thereof. The Group VIA ionic species comprises oxygen, sulfur, selenium, tellurium, polonium, or combinations thereof. The Group VIA ionic species is optionally obtained from an aqueous solution of oxides, halides, sulfates, nitrates, or ureates of the Group VIA species. The liquid coating composition optionally further comprises a solvent such as water, optionally deionized water. The liquid coating composition optionally has a pH of from about 9 to about 14, more optionally from about 10 to about 13 and most optionally from about 11 to about 12.

In one embodiment, a CdS layer is formed on substrate 50 by a solution deposition process. More specifically, first, a solution containing cadmium acetate (Cd(CH.sub.3 COO).sub.2), thiourea (NH.sub.2 CSNH.sub.2), ammonium acetate (CH.sub.3 COONH.sub.4) and ammonia was prepared. In this embodiment, the concentration of the cadmium acetate in the solution was 0.001M, the concentration of the thiourea was 0.005M, the concentration of the ammonium acetate was 0.001M and the concentration of the ammonia was 0.4M. The substrate coated in this solution to form a CdS layer on the substrate.

A variety of solution-based coating techniques may be used to apply the liquid including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. The surface of the substrate 50 can be modified by the addition of a wetting agent to the solution, such as glycerine. The liquid may also be a dispersion or ink containing the aforementioned materials. Depending on such surface tension, application of the liquid onto the substrate may optionally be conducted upside down.

Referring to FIG. 2, this embodiment shows that a spray technique is used to apply the liquid coating to the substrate 50. In this embodiment, the solution may be a mixture of 0.005-0.01M CdSO4 solution with 2M of NH4OH to pH of about 12. Optionally, a 0.3-0.5M thiourea solution is included. FIG. 2 shows that this embodiment uses a spraying assembly 60 configured to spray material onto the substrate 50. By way of example and not limitation, the spray assembly 60 may use a single nozzle, two nozzles, or multiple nozzles to spray liquid across the width of the substrate 50. One or more of the nozzles may be ultrasonic nozzles. Ultrasonic nozzles are commercially available from manufacturers such as J D Ultrasonics of the United Kingdom. Optionally, the nozzles may be dual jet nozzles that are configured for atomizing liquid across a wide web. There may be one or more these wide web nozzles in assembly 60. Optionally, one or more of the nozzles may be a vortex nozzle, wherein the flow from the nozzle is such that a vortexing flow exits the nozzle to define a cone-shaped spray. Optionally, wide web and vortex nozzles may be used in combination. The spray assembly 60 may be sufficient to spray across a substrate 50 that may have a width of greater than 0.5 meters. Optionally, the spray assembly 60 may be sufficient to spray across a substrate 50 that may have a width of greater than 1.0 meters. Optionally, the spray assembly 60 may be sufficient to spray across a substrate 50 that may have a width of greater than 2.0 meters. Optionally, the spray assembly 60 may be sufficient to spray across a substrate 50 that may have a width of greater than 3.0 meters.

It should also be understood that temperature of the solution or dispersion being deposited and/or that of the substrate may also be controlled. In one embodiment, the container containing this solution was put in a hot water bath kept at 85.degree. C prior to deposition and is deposited on a substrate at a lower temperature. In some embodiments, the substrate is at ambient temperature, or heated but to a temperature less than the temperature of the solution or dispersion to be deposited. Optionally, both the solution and the substrate 50 are at substantially the same temperature. In one embodiment, neither the solution or the substrate 50 are heated and both are at ambient temperatures. In other embodiments, the substrate 50 may be heated from ambient to about 60-90 C. In other embodiments, the solution or dispersion may actually be chilled or cooled to be below ambient temperature.

In another aspect, the amount of solution applied may be either a thin layer or it may be sufficient to create a bath of a depth of about 0.5 mm to about 5 mm in depth. Optionally, the bath may be about 0.5 microns to about 10 mm in depth. A shallow bath allows for sufficient coverage of the entire target surface of the substrate 50 while not substantially under-utilizing the raw material. The bath above the substrate 50 may be contained above the substrate 50 against a slidable seal and/or a movable seal. Optionally, the substrate 50 passes through a bath of the solution, wherein the substrate 50 may have a backside layer that can be removed.

Referring still to FIG. 2, a second deposition assembly 70 (shown in phantom) may also be used. This may be the same type of ultrasonic nozzle used in the solution deposition assembly 60. Optionally, it may one of the other types of deposition system such as but not limited to a vortex, wide-web, or other nozzle type different from the nozzle used in the solution deposition assembly 60. Optionally, the second deposition assembly 70 may include one or more of the following: wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, and the like, as well as combinations of the above and/or related technologies. The solution from assembly 70 may be the same as that from assembly 60 or it may be a component used in the process such as the thiourea solution or the like.

As seen in FIG. 2, after solution deposition by assembly 60 and/or 70, the substrate 50 enters an oven 80 for heating the solution to enable film growth or formation. In one embodiment, the oven 80 is used to heat the substrate to between 65-90 C. Optionally, some embodiments, may heat to higher temperatures such as 90-130 C. A variety of ovens may work. In one embodiment, the oven 80 comprises of an infrared oven is used to heat the substrate 50 and the solution over the substrate 50. Infrared ovens are available from a variety of manufacturers including Glenro Inc. of Paterson, N.J. Other embodiments may use muffles wherein the heating elements are located outside the tube furnace or muffle through which the substrate passes. The heating elements heat the muffle, which in turn heats the substrate. Some embodiments may only include heating element on one side of the oven 80 (e.g. top) or only on the other side (e.g. bottom). In one embodiment, the group IIB-VIA material over the substrate 50 may have a cured thickness of about 80-100 nanometers. Optionally, the thickness may be between about 100-150 nanometers.

After passing through the oven 80, the substrate 50 reaches a cleaning station 90. This cleaning system 90 may use a pressure spray of liquid such as but not limited to deionized water to remove unused or uncured solution applied to the substrate 50. The wash off from the pressure spray is collected and the waste liquid contained or processed for proper removal.

Optionally, a second cleaning station 100 is included. This may be an additional washing station similar to the cleaning station 90, it may be an air knife to dry the substrate 50, or it may be cleaning system using some other type of cleaning solution. The cleaning and/or drying may occur on only one side of the substrate 50 or it may be from the underside or other directions as indicted by stations 92 and 102 in phantom. Optionally, it may be a combined heating and air dry station to remove un-wanted material from the surface of the substrate and to prepare the substrate for the next stage of processing. In some embodiments, the heating may occur after the air drying and may use an infrared heating to increase the substrate temperature and to prepare it for the next layer to be deposited on the photovoltaic device. In one embodiment, the substrate 50 after the various processes above, is heated to 100 C. or higher at 2 meters per minute to dry the web or substrate 50 and to prepare it for the next layer.

Figure 3:
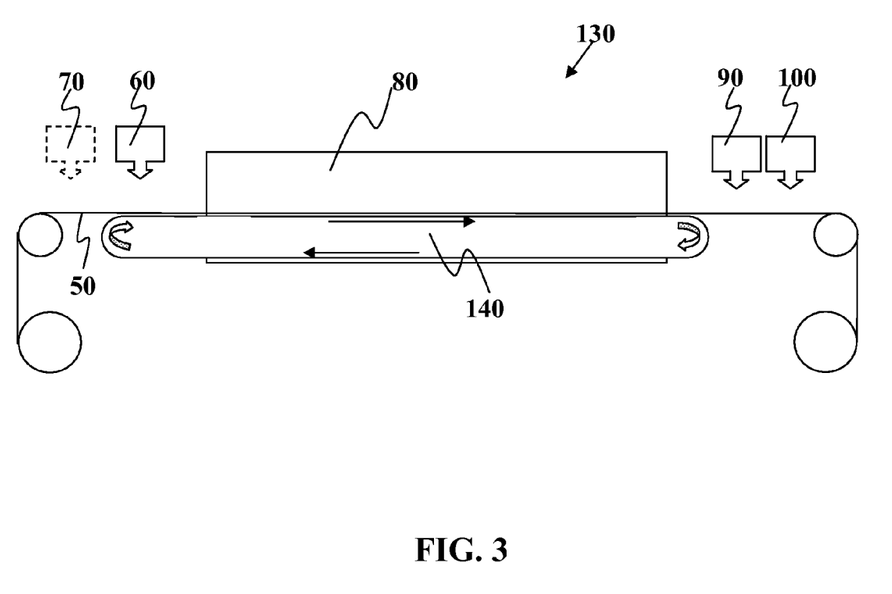
FIG. 3 shows a processing system according to another embodiment of the present invention.

Referring now to FIG. 3, another embodiment of the present invention will now be described. This embodiment shows a junction partner deposition system 130 with a solution deposition by assembly 60 and/or 70. The oven 80 is used to heat the solution deposited on the substrate 50 to from the assembly 60 and/or 70. This embodiment of the junction partner deposition system includes a vacuum pull belt system 140 which will help flatten the substrate 50 during the processing. This is particularly helpful as some wider flexible substrates 50 after deposition of semiconductor or other absorber material will curl and assume non-planar configurations without force or substrate guides to help flatten the substrate 50. Vacuum pull belt systems are available from manufacturers such as Kliklok-Woodman of Decatur Ga. Some systems may use an articulated floating vacuum pull belt arrangement as described in U.S. Pat. No. 5,715,656 and fully incorporated herein by reference for all purposes.

In this embodiment, the vacuum pull belt system 140 extends outside the oven 80. Optionally, in other embodiments, the vacuum pull belt system 140 may extend only within the boundaries of the oven 80. As seen in FIG. 3, the spray of the solution may occur over the system 140 by way of the spray assembly 60 or it may occur at a location of the substrate 50 spaced away from the belt system 140 as indicated by a spray assembly located at position 70.

Figure 4:
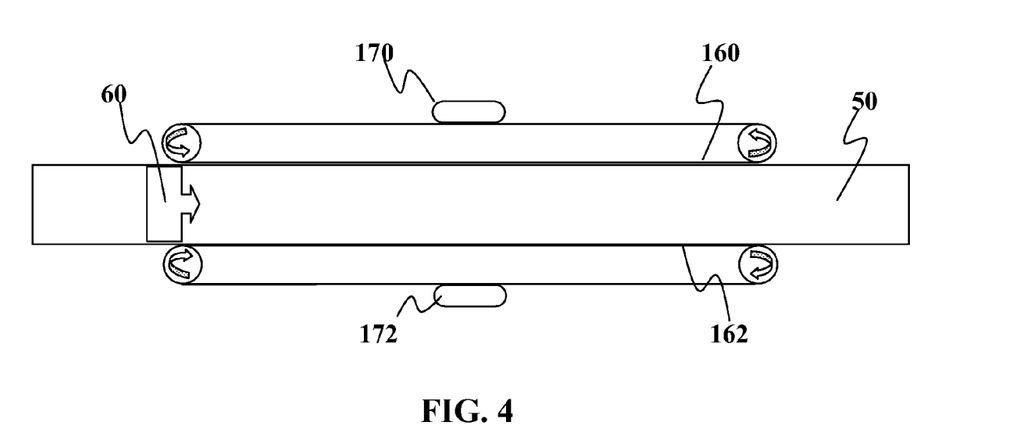
FIG. 4 shows a processing system according to another embodiment of the present invention.

FIG. 4 shows yet another embodiment wherein a moving seal systems 160 and 162 which may be alongside the areas where the solution is deposited on the substrate 50. FIG. 4 is a top down view of the substrate 50 and the seals of the systems 160 and 162 will form sidewalls against the substrate 50 that allows the bath to be formed over the substrate 50. In one embodiment, the seals of the systems 160 and 162 will also keep the bath or layer of solution on only one side of the substrate 50. The systems 160 and 162 may also be configured to have seals that move with the substrate 50. Other embodiments may have stationary seals that allow the substrate to slide along against it. Some embodiments may also include a dip in the substrate path to help prevent the solution from flowing too far downweb or upweb. Scrubbing units 170 and 172 may also be included to clean the surface of the seal to remove and undesired build up that may prevent a good seal against the substrate 50. Other embodiments may use the units 170 and 172 to apply sealant to help the seal against the substrate 50.

Still further embodiments may use two back to back substrates 50 to allow for higher utilization. To avoid waste or undesired processing, two substrates may be attached together "back-to-back" to form a dual substrate having, in effect, two front sides with the back sides protected against undesired treatment. Preferably, the substrates are attached in a manner that allows them to be separated from each other after processing. By way of example the substrates may be attached with a low-strength adhesive or electrostatic film applied to the back side of one or both substrates. Alternatively, an edge where the two substrates join may be sealed, e.g., with a tape, so that reactants cannot reach the back sides during processing. The dual substrate may then be wound into a coil and coated such that both front surfaces are treated while the back surfaces are not. Processing the substrate in this fashion may reduce the waste of reactants and may increase the area of the substrate that can be processed at one time. Optionally, other embodiments may use a sacrificial backside that is removed after processing to reveal a backside that is not processed. These systems are particularly suited for a bath-type system wherein the substrate is passed through a solution that exposes both sides of the substrate.

Figure 5:
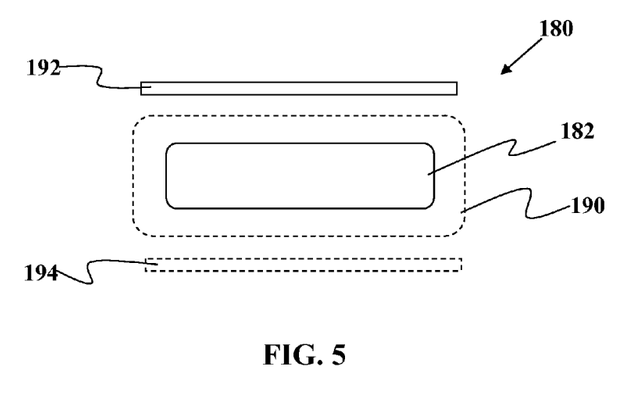
FIG. 5 shows cross-sectional view of a processing system according to one embodiment of the present invention.

Referring now to FIG. 5, it should be understood that the environment inside the oven may be different from the ambient atmosphere. Although some embodiments may used an ambient air environment inside the oven 180, other embodiments may use non-air atmospheres. By way of example and non-limiting example, the atmosphere in the muffle 182 may be comprised of ammonia or ammonia based material to prevent loss of ammonia or similar material from the solution. The loss of material may create a change in pH that changes the reaction dynamics. Other embodiments may use other atmospheres that create an overpressure of the material that may be volatile and escape from the solution during processing. The material in the gas environment of muffle 182 is based on what type of reaction is occurring and what materials may be vaporized or lost during processing.

FIG. 5 also shows in phantom that a second muffle 190 may be used around the inner muffler 182. The atmosphere in outer muffle 190 may be the same as that in the inner muffle 182. Optionally, the muffle 190 has an atmosphere different from that in the muffle 182. In one embodiment, the muffle 190 includes an inert atmosphere such as but not limited to nitrogen, argon, or the like. The muffle 190 may be the same length as the muffle 182. Optionally, the muffle 190 may be longer than the inner muffle 182 to prevent escape of gas into the outside environment. It would instead escape into the outer muffle 190. Optionally, each muffle may be inert gas zones near the inlet and outlet of each muffle to help prevent escape of the interior processing gas. FIG. 5 also shows how heater elements 192 and 194 may be located outside, above and/or below the muffle.

Figure 6:
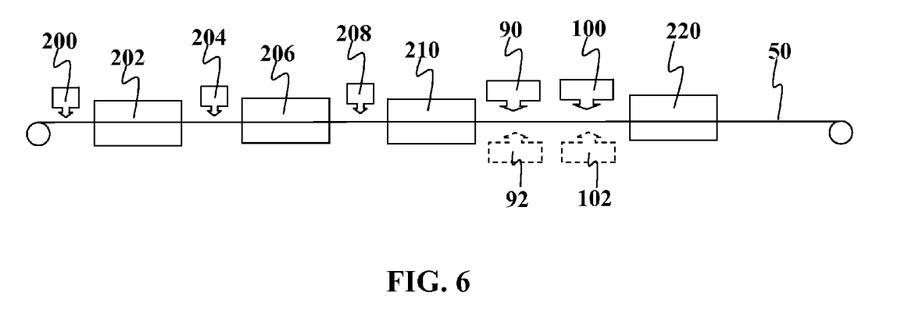
FIG. 6 shows a processing system according to another embodiment of the present invention.

Referring now to FIG. 6, yet another embodiment of the present invention is shown wherein multiple spray and heating locations are shown. In this embodiment, a spray section 200 is used to deposition the solution, followed by an oven section 202 to heat the liquid. This system is repeated by spray section 204, oven 206, spray section 208, and oven 210. The spray and oven sections may be repeated as desired to create the layer on the substrate 50 of the desired thickness. In this embodiment, each spray and oven section creates 25-35 nanometer thickness of the junction partner. Other embodiments may use deposition sections that create thicker or thinner layers. Some may also use sections to deposit different materials or different components used for the junction partner. Still other embodiments may use ovens that run at different temperatures. Some may have heat in 70-90 C. Optionally, others may heat higher to 90-130 C. Optionally, others may use lower temperatures of 55-75 C. The ovens may be arranged to go high heat to low heat. Optionally, they may go from low heat to high heat. Others may use a heat profile with high heat in the middle oven, but lower heat at the beginning or end ovens. This heating may be followed up by wash and dry units 90 and 100. An oven 220 may be included to further dry the substrate and/or prepare it for the next layer of processing. Some embodiment may roll directly to the next deposition section which may be a TCO sputtering or other deposition device. The substrate 50 may also come directly from CIGS or other absorber layer deposition and processing in a complete roll-to-roll process.

Figure 7:
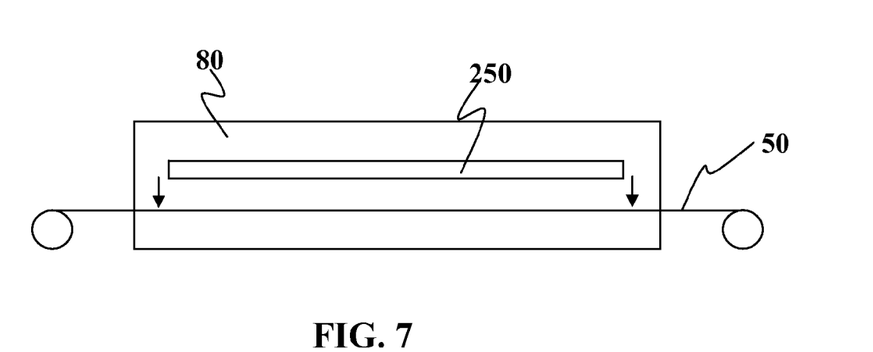
FIG. 7 shows a processing system according to another embodiment of the present invention.

Referring now to FIG. 7, a still further embodiment of the present invention will now be described. This embodiment uses a frame 250 that is raised and lowered over the substrate 50. In a step-repeat function, the substrate 50 may be advanced to place an unprocessed portion below the frame 250. The frame 250 is lowered to contact the substrate 50 or close enough to prevent significant loss (more than 10%) of the fluid over the substrate during processing. Again, any solution deposition may be used. A variety of solution-based coating techniques may be used to apply the liquid including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. The surface of the substrate 50 can be modified by the addition of a wetting agent to the solution, such as glycerine. The liquid may also be a dispersion or ink containing the aforementioned materials. Depending on such surface tension, application of the liquid onto the substrate may optionally be conducted upside down.

The oven 80 is heated during, before, or after deposition of fluid into the frame 250. After processing and heating, the frame 250 is raised and the substrate 50 is advanced to place a new, untreated section below the frame 250. Again, the oven 80 may have an ammonia or other atmosphere as described above. The frame 250 maybe filled multiple times over one section of the substrate 50 to build up the desired amount of thickness. Other embodiments may use a frame 250 that moves with the substrate to allow for a moving process where the substrate is not complete stopped. The frame 250 may be lowered down over an area of the substrate while it is outside the oven 80.

Figure 8:
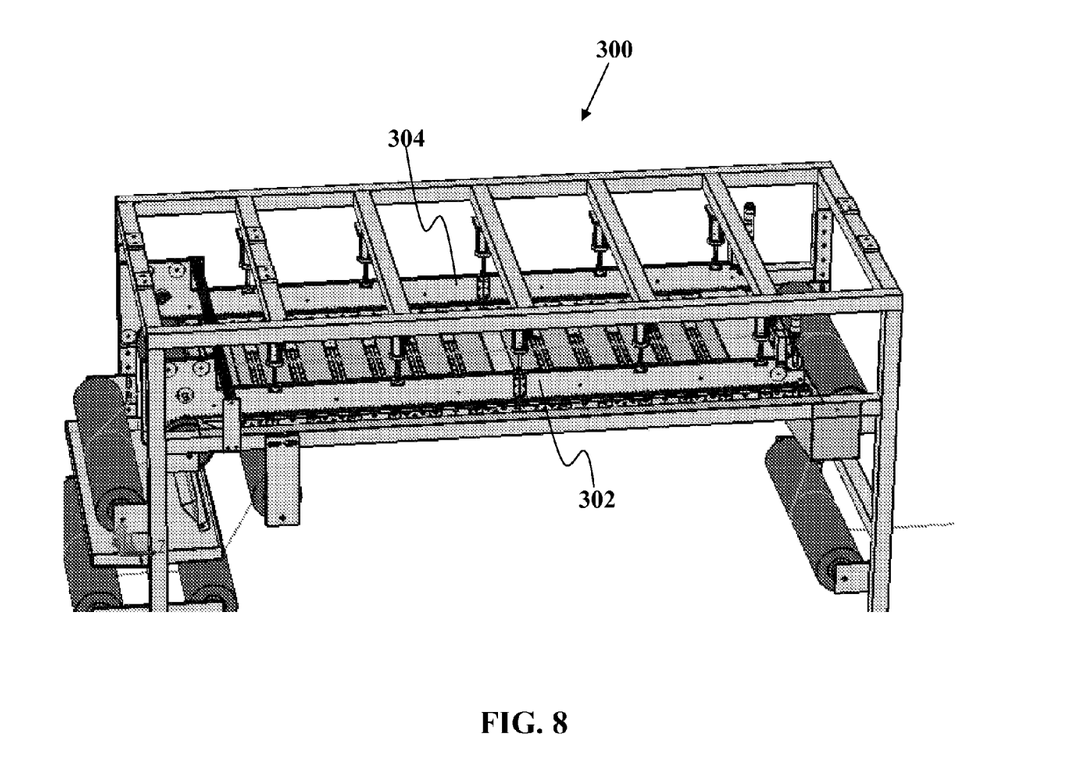
FIG. 8 shows a processing system according to another embodiment of the present invention.

FIG. 8 shows a still further embodiment wherein a bath type deposition system 300 is used with moving seals 302 and 304. The path of the substrate 50 through the system 300 may be lowered to create a bath inside the system 300 without spillage downweb or upweb. Again, any solution deposition may be used. A variety of solution-based coating techniques may be used to apply the liquid including but not limited to wet coating, spray coating, spin coating, doctor blade coating, contact printing, top feed reverse printing, bottom feed reverse printing, nozzle feed reverse printing, gravure printing, microgravure printing, reverse microgravure printing, comma direct printing, roller coating, slot die coating, meyerbar coating, lip direct coating, dual lip direct coating, capillary coating, ink-jet printing, jet deposition, spray deposition, ultrasonic spray deposition, and the like, as well as combinations of the above and/or related technologies. The surface of the substrate 50 can be modified by the addition of a wetting agent to the solution, such as glycerine. The liquid may also be a dispersion or ink containing the aforementioned materials. Depending on such surface tension, application of the liquid onto the substrate may optionally be conducted upside down.

Heating of the web may occur after the deposition has occurred or at the same time. Optionally, the solution may itself be heated to a temperature above that of the substrate.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, with any of the above embodiments, although glass is the layer most often described as the top layer for the module, it should be understood that other material may be used and some multi-laminate materials may be used in place of or in combination with the glass. Some embodiments may use flexible top layers or coversheets. By way of nonlimiting example, the backsheet is not limited to rigid modules and may be adapted for use with flexible solar modules and flexible photovoltaic building materials. Embodiments of the present invention may be adapted for use with superstrate or substrate designs. Details of modules with thermally conductive backplanes and heat sinks can be found in commonly assigned, co-pending U.S. patent application Ser. No. 11/465,783 filed Aug. 18, 2006 and fully incorporated herein by reference for all purposes. Other backsheet materials may also be used and is not limited to glass only embodiments. The housing of the connector could be made of any material by any method. The tool designs of this invention may also be used for continuous, in-line processing of substrates which may be in the form of a web or in the form of large sheets such as glass sheets which may be fed into the reactor in a continuous manner. Depending on the material being sputtered in the chamber, the gas may be an inert gas such as nitrogen, argon or helium or a reducing gas such as a mixture of hydrogen (e.g. 2-5% mixture) with any inert gas. The material to be applied in the chamber may be a group IB, IIIA, and/or VIA material. The system may be used to apply Cu—In, In—Ga, Cu—Ga, Cu—In—Ga, Cu—In—Ga—S, Cu—In—Ga—Se, or other alloys. The system may be used to sputter transparent oxide material such as AZO, ITO, i-AZO, or other transparent electrode material.

Furthermore, those of skill in the art will recognize that any of the embodiments of the present invention can be applied to almost any type of solar cell material and/or architecture. For example, the absorber layer in solar cell 10 may be an absorber layer comprised of silicon, amorphous silicon, organic oligomers or polymers (for organic solar cells), bi-layers or interpenetrating layers or inorganic and organic materials (for hybrid organic/inorganic solar cells), dye-sensitized titania nanoparticles in a liquid or gel-based electrolyte (for Graetzel cells in which an optically transparent film comprised of titanium dioxide particles a few nanometers in size is coated with a monolayer of charge transfer dye to sensitize the film for light harvesting), copper-indium-gallium-selenium (for CIGS solar cells), CdSe, CdTe, Cu(In,Ga)(S,Se)$_2$, Cu(In,Ga,Al)(S,Se,Te)$_2$, and/or combinations of the above, other absorber materials, IB-IIB-IVA-VIA absorber solar cells, other thing film solar cells, and where the active materials are present in any of several forms including but not limited to bulk materials, micro-particles, nano-particles, or quantum dots. The CIGS cells may be formed by vacuum or non-vacuum processes. The processes may be one stage, two stage, or multi-stage CIGS processing techniques. Additionally, other possible absorber layers may be based on amorphous silicon (doped or undoped), a nanostructured layer having an inorganic porous semiconductor template with pores filled by an organic semiconductor material (see e.g., US Patent Application Publication US 2005-0121068 A1, which is incorporated herein by reference), a polymer/blend cell architecture, organic dyes, and/or $C_{60}$ molecules, and/or other small molecules, micro-crystalline silicon cell architecture, randomly placed nanorods and/or tetrapods of inorganic materials dispersed in an organic matrix, quantum dot-based cells, or combinations of the above. Many of these types of cells can be fabricated on flexible substrates.

Additionally, concentrations, amounts, and other numerical data may be presented herein in a range format. It is to be understood that such range format is used merely for convenience and brevity and should be interpreted flexibly to include not only the numerical values explicitly recited as the limits of the range, but also to include all the individual numerical values or sub-ranges encompassed within that range as if each numerical value and sub-range is explicitly recited. For example, a thickness range of about 1 nm to about 200 nm should be interpreted to include not only the explicitly recited limits of about 1 nm and about 200 nm, but also to include individual sizes such as but not limited to 2 nm, 3 nm, 4 nm, and sub-ranges such as 10 nm to 50 nm, 20 nm to 100 nm, etc. . . . . .

The publications discussed or cited herein are provided solely for their disclosure prior to the filing date of the present application. Nothing herein is to be construed as an admission that the present invention is not entitled to antedate such publication by virtue of prior invention. Further, the dates of publication provided may be different from the actual publication dates which may need to be independently confirmed. All publications mentioned herein are incorporated herein by reference to disclose and describe the structures and/or methods in connection with which the publications are cited.

While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for."

What is claimed is:

1. A deposition system for use with a substrate, the system comprising:
    a solution deposition apparatus;
    at least one heating chamber;
    at least one assembly for holding solution over the substrate to allow for a depth of at least about 0.5 microns to 10 mm; and
    a plurality of seals that define a volume where fluid can be held over the substrate, wherein the seals move with the substrate during at least a portion of substrate processing.

2. The system of claim 1 wherein the substrate comprises of a flexible material.

3. The system of claim 1 wherein the system includes multiple zones at different temperatures.

4. The system of claim 3 wherein certain zones have enclosed atmospheres.

5. The system of claim 1 wherein the seals move at the same rate as the substrate.

6. The system of claim 1 wherein the system is configured such that the substrate will be at a temperature less than a temperature of the solution or a dispersion to be deposited on the substrate.

7. The system of claim 1 wherein both the solution and the substrate are at substantially the same temperature.

8. The system of claim 1 wherein neither the solution or the substrate are heated and both are at ambient temperatures.

9. The system of claim 1 wherein the substrate is heated from ambient to about 60-90 C but the solution is at a still higher temperature.

10. The system of claim 1 wherein the substrate comprises of a metal foil.

11. The system of claim 1 wherein the solution comprises a precursor for forming a junction partner for a group IB-IIIA-VIA absorber layer.

12. The system of claim 1 wherein the solution comprises a precursor for forming a Group IIB-VIA junction partner.

13. The system of claim 1 wherein the solution comprises a precursor for forming a junction partner selected from the group consisting of: cadmium sulfide (CdS), zinc sulfide (ZnS), zinc hydroxide, zinc selenide (ZnSe).

14. The system of claim 1 wherein the solution comprises of a Group IIB ionic species is obtained from an aqueous solution of one or more of the following: sulfate, acetate, bromide, fluoride, chloride, iodide, hydroxide, nitrate, oxalate, citrate, phosphate, tungstate, or hydrates of the Group IIB species.

15. The system of claim 1 wherein the solution comprises of a Group VIA ionic species is obtained from an aqueous solution of one or more of the following: oxides, halides, sulfates, nitrates, or ureates of the Group VIA species.

16. The system of claim 1 wherein the solution has a pH of from about 9 to about 14.

17. The system of claim 1 wherein the solution has a pH of from about 11 to about 12.

18. The system of claim 1 wherein the assembly for holding solution is at least partially contained in the heating chamber.

19. A deposition system for use with a substrate, the system comprising:
- a solution deposition apparatus;
- at least one heating chamber;
- at least one assembly for holding solution over the substrate to allow for a depth of at least about 0.5 microns to 10 mm; and
- a plurality of seals that define a volume where fluid can be held over the substrate, wherein the seals move at the same speed as the substrate.

20. A deposition system for use with a substrate, the system comprising:
- a solution deposition apparatus;
- at least one heating chamber;
- at least one assembly for holding solution over the substrate to allow for a depth of at least about 0.5 microns to 10 mm; and
- a movable seal system that defines a volume over which fluid can be held over the substrate.

* * * * *